(12) United States Patent
Roge et al.

(10) Patent No.: US 6,721,202 B1
(45) Date of Patent: Apr. 13, 2004

(54) BIT ENCODED TERNARY CONTENT ADDRESSABLE MEMORY CELL

(75) Inventors: Manoj B. Roge, San Jose, CA (US); Ajay Srikrishna, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 73 days.

(21) Appl. No.: 10/027,553

(22) Filed: Dec. 21, 2001

(51) Int. Cl.[7] ............................................... G11C 11/56
(52) U.S. Cl. ..................... 365/168; 365/49; 365/185.07; 365/189.02; 365/189.07; 365/226
(58) Field of Search ...................... 365/49, 226, 189.07, 365/189.02, 168, 185.07

(56) References Cited

U.S. PATENT DOCUMENTS

| | | | |
|---|---|---|---|
| 3,229,255 A | 1/1966 | Anderson | 365/79 |
| 5,440,715 A | 8/1995 | Wyland | 711/108 |
| 6,108,227 A | 8/2000 | Voelkel | 365/49 |
| 6,137,707 A | 10/2000 | Srinivasan et al. | 365/49 |
| 6,154,384 A | 11/2000 | Nataraj et al. | 365/49 |
| 6,237,061 B1 | 5/2001 | Srinivasan et al. | 711/108 |
| 6,411,538 B1 * | 6/2002 | Kengeri | 365/49 |
| 6,480,406 B1 * | 11/2002 | Jin et al. | 365/49 |
| 6,496,399 B1 * | 12/2002 | Choi et al. | 365/49 |

OTHER PUBLICATIONS

SiberCAM™ Application Note, SiberCore Technologies, Inc., Nov. 2000, pp. 1–3.
"The Next Generation of Content Addressable Memories," MOSAID Technologies, Inc., Sep. 1999, pp. 1–7.
"New Protocols and CAMs Team up to Ease the Design of High–Performance Routers and Switches," Netronics, Oct. 2000, pp. 40–46.
"What is a CAM (Content Addressable Memory)?" Music Semiconductors, Application Brief AB–N6, Sep. 1998, pp. 1–4.
"High Performance Layer 3 Forwarding: The Need for Dedicated Hardware Solutions," © 2000 NetLogic Microsystems, Inc., pp. 1–6.

* cited by examiner

Primary Examiner—Michael S. Lebentritt
Assistant Examiner—Pho M. Luu
(74) Attorney, Agent, or Firm—Kevin L. Daffer; Conley Rose P.C.

(57) ABSTRACT

Architecture, circuitry and method are provided for a ternary content addressable memory (TCAM), and use thereof. Each TCAM cell is relatively small in size. If the TCAM cell is called upon to store voltage values indefinitely, provided power is retained on the cell, the TCAM cell employs no more than 16 transistors. Additional savings in size is achieved by using a single common conductor (or dual common conductors in a differential arrangement) to suffice as both the bit line and compare line. The common bit line and compare line connects to not only the X memory cell, but also the Y memory cell and the compare circuit of the TCAM cell. The compare circuit can either be activated or deactivated. During a compare operation, the compare circuit is selectively activated by placing a ground supply upon a match line enable conductor. The ground supply is imputed upon the match line whenever a mismatch occurs to designate that mismatch. Otherwise, during a normal read or write operation, the match line enable is placed at the same voltage value as the pre-charged match line.

19 Claims, 3 Drawing Sheets

BIT ENCODED TERNARY CONTENT ADDRESSABLE MEMORY CELL

BACKGROUND OF THE INVENTION

1. Field of the Invention

This invention relates to semiconductor memory and, more particularly, to a ternary Content Addressable Memory (CAM) cell that uses a shared bit and compare line, and employs no more than sixteen transistors when implemented as an SRAM based memory cell.

2. Description of the Related Art

The following descriptions and examples are not admitted to be prior art by virtue of their inclusion within this section.

CAM is a memory device designed to accelerate any application that requires extremely fast searches of a database, list, pattern, image, or voice recognition stored within a computer or a communication network. Contrary to conventional memory devices, CAMs do not store data in any structured fashion. The locations at which data is stored within a CAM can be random, where the data can be written directly into the first empty location within the CAM. Once data is stored in CAM, it can be found by comparing every bit in the CAM memory with data placed in a comparand register. If a match exists for every bit stored in a particular word line location within the CAM corresponding to every bit in the comparand register, a match line is asserted. Accordingly, a CAM operates opposite that of a conventional memory device by receiving data and returning an address.

One advantage of a CAM is that extremely quick searches can be undertaken, whereby the entire array of CAM cells is searched in a single clock cycle. If a match is found, the address is returned. That address is then used to retrieve data associated with the search string. The address is typically used to retrieve associated data stored in a discrete memory specified by the result of the CAM search.

CAM devices are particularly well suited for handling packet protocols, such as TCP/IP protocols employed in packet processors that are used to route information across an intranet or internet. Attributable to an intranet or internet is a packet-forwarding engine, oftentimes referred to as a switch or router. The switch or router receives the incoming packet and then parses the packet header to assemble the information related to the enclosed data, or payload. Additionally, the forwarding engine must extract relevant fields of bits to determine where and how to send the accompanying payload. The process of extracting source address information and forwarding the payload to a destination address may require multiple lookups.

A packet may contain both a destination network field and a destination host field. Beginning with the network destination field, a lookup will be needed to determine if the forwarding engine resides on a particular destination network. Thereafter, the forwarding engine must determine if, within the destination network, it resides upon a destination host. Internet protocol version 4 (IPv4) specification has established certain classes of segmentation. For example, class C IPv4 addresses have an 8-bit network ID field and a 24-bit host ID field. As the use of the internet has increased, the number of IPv4 addresses has also increased. Segmenting the host and destination fields can oftentimes be inefficient if, for example, a user is barely within an upper class usage, resulting in his/ her inefficient use of the IP addresses allocated to that user. Accordingly, a classless IP addressing scheme, referred to as Classless Inter-Domain Routing (CIDR), has arisen. According to CIDR, a floating boundary exists between the destination network field and the destination host field. The network field indicates the "prefix length" of the CIDR address.

With the advent of CIDR, a need existed for producing a new generation of CAMs. The ternary CAM, or TCAM, is designed to take advantage of the CIDR addressing scheme. In the routing table of a TCAM, entries are ordered such that the CIDR address with the longest prefix (the greatest number of bits in the network field) may be located in the lowest numerical address of the TCAM. The TCAM, therefore, has a main memory cell array and a mask memory cell array, where the main memory cell is used to store, for example, the network destination address. The mask memory cell can store a masking bit. The array of masking cells are, therefore, used to mask certain bits from the lookup operation. For example, the masking bits could be those of the host field, such that faster lookup can occur on only the network field first, followed by unmasked host field lookup second.

While TCAMs prove helpful in speeding up the routing process, especially in CIDR addressing, TCAM cells can be quite large -resulting in large die sizes. While it is desirable to utilize the features of a TCAM, it is also desirable to minimize the size of a TCAM cell and, thus, the size of an array of TCAM cells within a TCAM device. The desired TCAM device should, therefore, be relatively small and not suffer the burden of using extra bit lines and compare lines of conventional cells. The desired TCAM cell of minimal size would not only be more cost effective to make, but also allow for a larger array of cells to accommodate the increasing size of routing tables contained therein. In addition, as the cell size increases, so does the die size, which may lead to issues with viable manufacturability (due to increased manufacturing defects and consequent low yields) especially at higher densities.

SUMMARY OF THE INVENTION

The problems outlined above are in large part solved by an improved ternary content addressable memory (TCAM) device. A TCAM, in general, contains an array of main memory cells, mask memory cells, and compare circuits. In one feature of the present invention, further saving of area is achieved by encoding of the "value" and "mask" of the main memory cell and mask memory cell (in circuitry external to the memory array) and the resultant bit-encoded values are stored in what is hereinafter known as an "X" memory cell and a "Y" memory cell. A TCAM cell within the array employs a compare circuit interposed between the X memory cell and the Y memory cell.

For each TCAM cell, a single bit line/compare line conductor is used. The bit line/compare line conductor, or common conductor, is connected to the X memory cell, the Y memory cell, and the compare circuit. The common conductor can receive a voltage value to be stored in the X memory cell or the Y memory cell during a write operation, or to be read from the X memory cell or the Y memory cell, and can also receive a voltage value to be compared with the previously stored voltage value within the X and Y memory cells. The common conductor, therefore, can receive data to be written to or read from the X memory cell or the Y memory cell, or data to be compared with previously stored data in the X and Y memory cells.

A write operation can be encoded based on the value of a bit forwarded with a packet. The write operation indicates that a user is intending to change, for example, the routing tables within the TCAM cell. By writing a new voltage value at one or more X and Y memory cells, the user can change the packet-forwarding engine attributable to the TCAM. Thereafter, quick lookup can occur by performing a compare operation of subsequently sent packets with the network identification field or host identification field stored within the memory cell array. If the comparison indicates a match with all corresponding bits within a CAM word, then a match line will yield a logic value that is then presented to a priority encoder. In the case of a multiple match, the priority encoder will select the match line entry that has the lowest numerical address within the memory array (i.e., the address having the longest matching prefix).

The common conductor is therefore used not only during the write and read operations, but also during the compare operation based on the encoding of bits indicative of the operation being employed. Either the bit value being written to the memory cell or being read from the memory cell, or the bit value being compared with previously stored values are multiplexed onto a differential pair of common conductors (one conductor being the bit line/compare line, and the other conductor being the complimentary bit line/ complimentary compare line).

Multiplexed bit line/compare line will avoid having to use additional lines, where one line is dedicated to receiving the compare signal and another line is dedicated to receiving the bit line signal. Avoiding an additional two conductive lines (i.e., two metal lines) of a conventional, differential TCAM cell not only reduces the size of the cell, but also the complexity by which it is interconnected with other TCAM cells within the overall array. It is contemplated that the transistors can be formed of numerous Field Effect Transistor (FET) technologies, including Metal Oxide Semiconductor (MOS) or bipolar.

According to one embodiment, the TCAM cell uses six transistors in the X memory cell portion, six transistors in the Y memory cell portion, and four transistors in the compare circuit portion. The 16 transistors are repeated for each TCAM cell across the array of TCAM cells. A mere savings of one transistor per TCAM cell could equate to several thousand transistors if there are, for example, 256 CAM words, each bearing a 48-bit length (i.e., 256×48).

According to another embodiment, the storage cell is coupled to store a first voltage value forwarded across the common conductor. The first voltage value can be a logic 1 or logic 0 voltage value that is placed within, for example, a X memory cell and a logic 1 or logic 0 value that is placed within, for example, a Y memory cell. The compare circuit suffices to compare the logic 1 or logic 0 voltage value placed within the X memory cell and the logic 1 or logic 0 voltage value placed within the Y memory cell (collectively called first voltage value) with a logic 1 or logic 0 voltage value (second voltage value) forwarded to the memory. The conductor, therefore, receives written data or compares data at dissimilar times, each of which are multiplexed onto the conductor.

The X memory cell and the Y memory cell preferably include latches which can store a voltage value for an indefinite period of time, provided power is retained on the memory cell. The compare circuit is configured to receive a match line and a match line enable. The match line indicates the result of a compare operation, and the match line enable can be selectively coupled to power or ground, for example. The match line can be pulled to power through a pull-up transistor. If, during the compare operation, data stored in the X and Y memory cells matches the incoming data, then the outcome is a match and the match line remains pre-charged to power. The match line enable is coupled to ground during a compare operation in order to pull down the match line if the outcome is not a match. However, during a read or write operation (when compare is not being performed), the match line enable conductor is placed at a power voltage level equivalent to the power level at which the match line is pre-charged. Placing a power supply voltage upon the match line enable to equal the pre-charged match line will effectively cause the compare circuit to be deactivated during the read or write operation, and no current path can exist through the four transistors of the compare circuit. As such, the compare circuit consumes no power during a read/write operation, and can only consume power during a compare operation—when a match does not exist, i.e., when the match line is pulled down from its pre-charged state to the voltage level (ground) on the match line enable.

BRIEF DESCRIPTION OF THE DRAWINGS

Other objects and advantages of the invention will become apparent upon reading the following detailed description and upon reference to the accompanying drawings in which.

Figure 1:
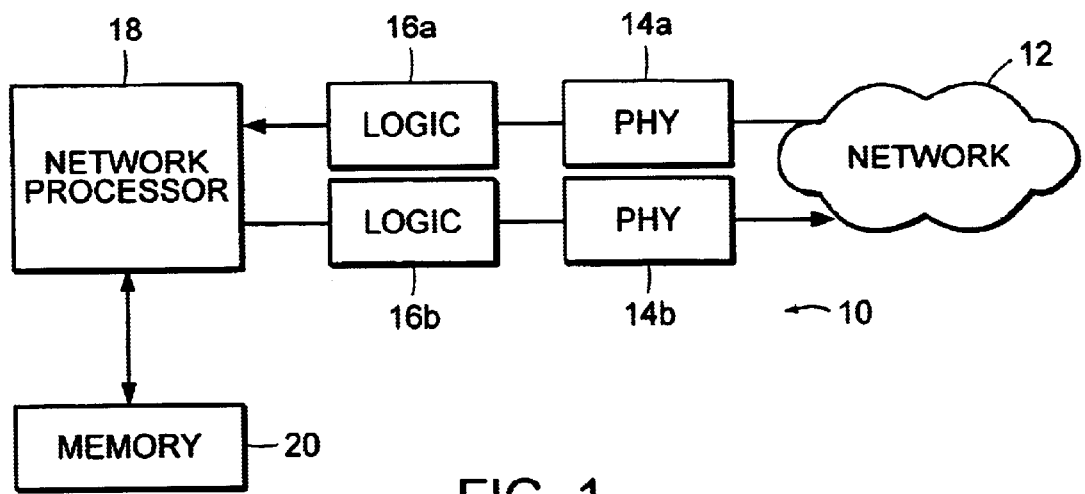
FIG. 1 is a block diagram of a packet forwarding engine (e.g., switch or router) within a communication network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a packet-forwarding subsystem 10 connected to a network 12. Packets of data are forwarded, or routed, by subsystem 10 either back onto network 12, or onto another network (intranet) within a business organization, for example. Packets from a sender can be forwarded from network 12, and enter mechanism 10 through physical layer device 14a. Physical device 14a provides a physical termination to the physical transmission media (for example, twisted pair, coax fiber, etc.). A media-access controller can then perform "layer 2" functions by converting the received signal into an electrical format for use within the forwarding engine of mechanism 10. As noted herein, the various "layers" described are those which follow Open System Interconnection (OSI) protocols, where layer 1 is the physical layer at which device 14 resides, and which interfaces using the various Ethernet, Token Ring, FDDI, X:25, etc. connection standards. Logic 16a may partially suffice as the media-access controller which performs at layer 2 function, and forwards the incoming packet onto the packet processor, or network processor 18. Processor 18 then parses the packet header to assemble the information related to the enclosed data, or payload. Processor 18 can also extract relevant fields, such as the source and destination identification fields, each of which are attributable to the network identification field and the host identification field. In addition to source and destination identifiers, processor 18 can also process information about class of service, quality of service, priority, security, encryption/decryption, and other features attributable to the packet.

Processor 18 is connected to, or incorporated with, some form of memory 20. Memory 20 preferably contains lookup tables that, among other things, identifies forwarding mechanism 10 relative to other forwarding mechanisms within the overall network. If the address being forwarded from network 12 matches with a destination address within memory 20, then the associated payload is presented to, for example, a host computer locally connected to forwarding mechanism 10. If, however, the lookup does not present a match, then a signal may be sent back from network processor through logic 16b, and back out through the physical layer device 14b to network 12. Physical layer device and logic attributable to data layer protocols and higher are designated with reference numerals 14a, 16a, 14b, and 16b, depending on whether network processor 18 is the recipient of a packet or is the originator of a packet. Thus, reference numeral "a" indicates the receive path, and reference numeral "b" represents the transmit path.

The rate at which packets are forwarded across the network varies depending on the speed of that network. For example, an OC-192 transmission path requires speeds of approximately 10 Gbits per secondA number of solutions have been developed to address the packet-forwarding functions. For example, 10 base-T hubs, bridges, and routers using lookups to external SRAM can fetch and execute lookups at around 100 thousand to 500 thousand searches per second. Thus, more sophisticated algorithms may be needed on the faster pipes and, thus, most routers employ a proprietary search algorithm and use sophisticated pipelining of data. Each pipeline may consist of seven or more cycles that enter the pipeline.

Recently, a new method of packet forwarding has been developed based on CAM architectures. The advent of TCAMs resulted from the need for handling the rapidly growing number of IP addresses and the substantial growth in data-transmission speeds. In effect, CAMs perform massively parallel lookups (or searches/compares) in hardware.

The TCAM architecture is based on the principal of imputing "don't care" states in the TCAM memory array. Being able to mask out certain bits within one or more words of a network identification field or host identification field substantially minimizes the search or compare operation time. More importantly, TCAMs can be used to extend the useful life of classless IPv4 forwarding protocols.

Figure 2:
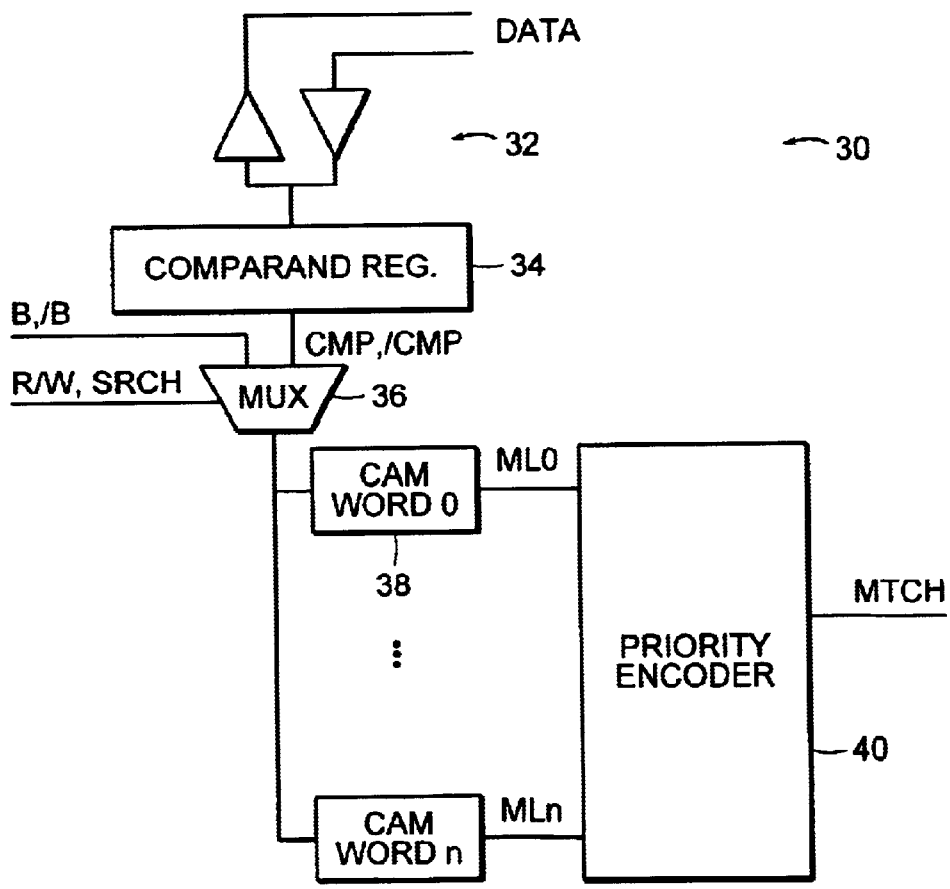
FIG. 2 is a block diagram of read, write and search/ compare operations performed on a CAM device with a capacity of M bits and N words.

FIG. 2 generically illustrates a CAM or TCAM device 30. The CAM device receives data to be written into storage cells or compared with pre-existing data within storage cells. The data can also be read from the storage cells. Writing data to, reading data from, and comparing data with data previously stored takes place through an input/output port 32.

CAM 30 is based on memory cells that have been modified by the addition of extra transistors that compare the state of the bits stored with the state stored in a comparand register 34. During a write or read operation, each CAM cell within CAM device 30 acts like a normal SRAM cell, with differential bit lines (B and /B) used to latch the value into the cell during a write operation, and sense amplifiers to detect the stored value during a read operation. During a compare operation, differential compare lines (CMP and /CMP) are used in lieu of the differential bit lines.

A multiplexer 36 may be used to forward either the differential bit lines or the differential compare lines into each of the CAM memory cells. The multiplexer (or select circuit) 36 is used to enable the differential bit lines during a read or write operation, or to send the differential compare lines during a search (or compare) operation. The multiplexer performs its selection similar to an encoder, which encodes whether the operation is a read/write operation or the operation is a compare operation. The bit lines and compare lines are, therefore, placed upon a common conductor pair, with one conductor being reserved for the bit line and compare line voltage values and the other conductor being reserved for the complimentary bit line and complimentary compare line voltage values. Thus, each bit within comparand register 34 is placed on a corresponding conductor. For example, if register 34 can store 48 bits, then there might be 48 multiplexers and 48 differential conductors for each CAM word 38. If there are n number of CAM words, and m number of multiplexers, the CAM device 30 is m bits wide and n words deep.

If every bit within comparand register 34 compares with every bit in one or more CAM words 38, then a match flag is asserted upon a corresponding match line (ML0–MLn). An asserted match line indicates that the data stored within register 34 was found within all CAM cells of one or more CAM words 38. Priority encoder 40 will determine which of the match lines has top priority. If there is more than one match line, then encoder 40 will make available a matching address to the user, noted which is the match address (MTCH). CAM device 30 is, therefore, illustrative of data being forwarded to the device, and the address of the data being presented as the output from the device if, indeed, a match occurs. The relatively fast parallel search capabilities of CAM device 30 is particularly useful in any application that requires fast lookups. While routers and switches that employ packet processors requiring fast lookup is one application, there may be numerous other applications particularly suitable for use of CAM device 30.

Priority encoder 40 is designed to select the longest matching prefix. Encoder 40 does so by determining which match line (ML0–MLn) that indicates a match is attributable to the lowest numerical CAM address. For example, CAM word n may be at CAM address 0, whereas CAM word 0 may be at the highest CAM address. The lowest CAM address or addresses may have a 32-bit prefix, while the highest CAM address or addresses may have less than 24-bit prefixes. If an incoming data pattern matches every bit within CAM word n, as well as every bit within, for example, CAM word 5, then CAM word n (MLn) will be selected since it has the lowest physical address. Selection is performed by encoder 40. The longest matching prefix output from encoder 40 is then forwarded to an associated data storage device, such as an SRAM or DRAM.

CAM device 30 and encoder 40, therefore, perform the important function of quickly looking up, for example, a destination address sent within a network identification field or a host identification field. That address is quickly compared against an address stored within the CAM entry. If the compare yields a match in one or more words across the entire array, then encoder 40 will select the match with the lowest physical address and forward the matching address to an associated data storage device. The mechanism by which the masking array is used to mask certain bits within the CAM words being compared helps minimize the compare time. For example, one or more bits within a prefix can be masked or an entire prefix can be masked, such that any matches to the masked bits will not register as a match. The network processor, in conjunction with the TCAM cell, performs as a CIDR processor to operate as a longest prefix match engine.

Figure 3:
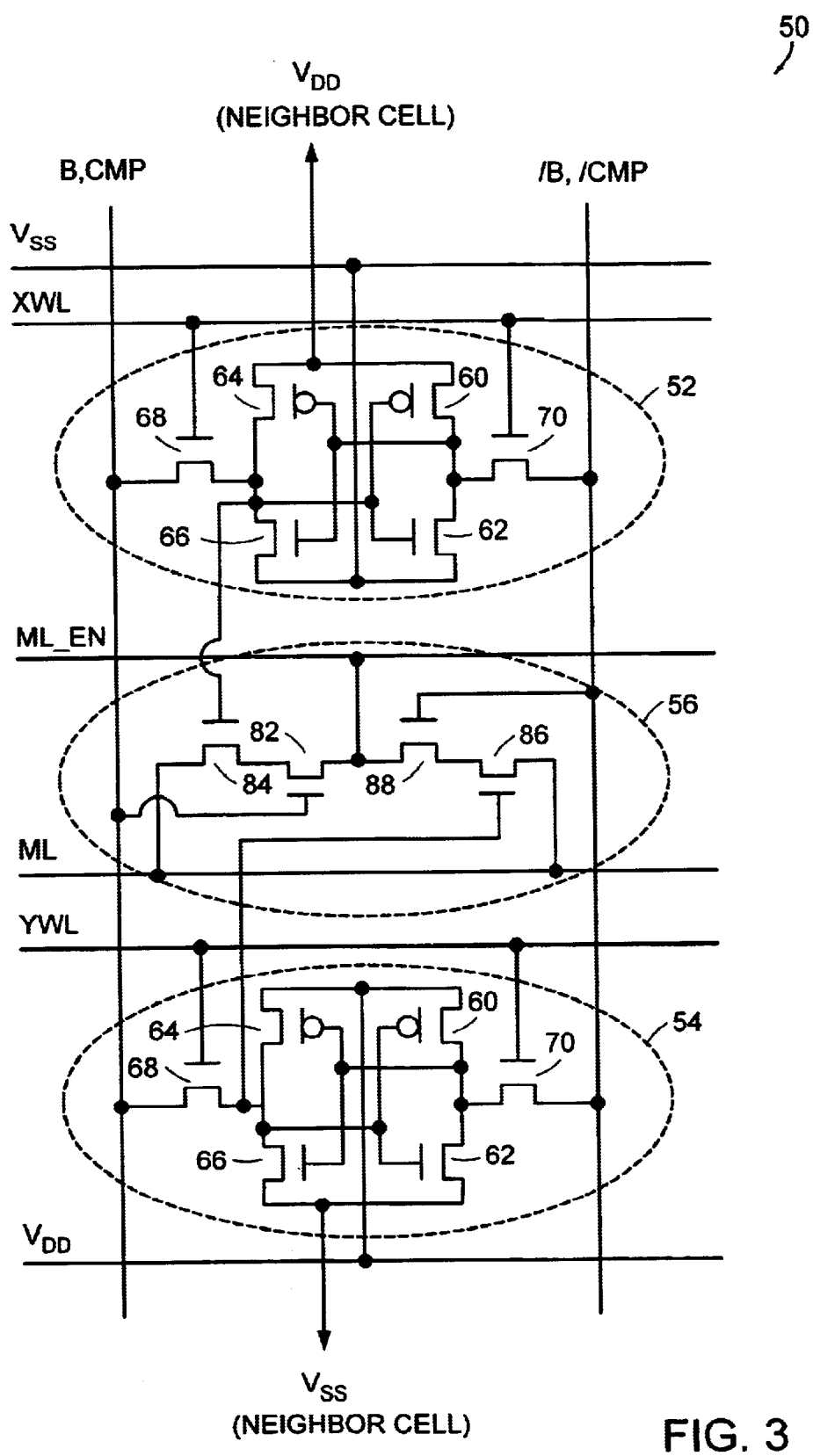
FIG. 3 is a circuit schematic of a single ternary CAM cell portion (i.e., one of M bits) of a word (i.e., one of N words) shown in FIG. 2, wherein only sixteen transistors are needed to form the CAM cell, and where the read/write data (i.e., B,/B) and data to be compared (i.e., CMP,/CMP) are multiplexed onto a single conductor depending on whether the CAM cell is undergoing a read/write operation or a compare operation.

FIG. 3 illustrates a TCAM cell architecture 50. TCAM cell 50 includes three subcomponents: X memory cell 52, Y memory cell 54, and compare circuit 56. Subcomponents 52, 54, and 56 are repeated for each bit of a CAM word and for each CAM word to form an array of neighboring TCAM cells. Each TCAM cell, however, includes component 52, 54, and 56, as well as various input and output conductors connected thereto.

X memory cell 52 is substantially identical to Y memory cell 54. Each such cell includes a cross-coupled pair of inverters made up of four transistors 60, 62, 64, and 66. Transistor pair 60 and 62 form an inverter with its input connected to the output of transistors pair 64 and 66 which form the other inverter. Likewise, the input of inverter pair 64 and 66 is connected to the output of inverter pair 60 and 62. In addition to the latching arrangement of transistors 60–66, X memory cell 52 and Y memory cell 54 also include a pair of pass transistors 68 and 70. The gate conductor of pass-through transistors 68 and 70 are coupled to corresponding word lines, and the source node of such transistors are coupled to corresponding bit (or compare) lines. Whenever a write operation occurs to X memory cell 52, the X word line (XWL) will transition to a logic high voltage value, causing the bit placed on the differential bit line B and /B to be forwarded to the latching pairs of transistors 60–66. Likewise, any write operation to Y memory cell 54 will involve activation of pass-through transistors 68 and 70 by activating the Y word line (YWL). Thus, during a write operation, the corresponding word line (XWL or YWL) is asserted high, and the write data path pulls one of the bit lines low and the data is written into the corresponding memory cell similar to a normal SRAM write operation. During a read operation, the corresponding word line (XWL or YWL) is asserted high, and the split (or voltage difference) on the bit lines B and /B is sensed by the data read path. Once the differential on the bit line pairs is latched by the read sense amp, the bit lines are pre-charged back to their original high logic values.

A read or write operation involves strobing the appropriate word lines while forwarding data to or from the latching pairs of transistors via the differential bit lines B and /B. However, a compare or search operation does not involve activation of any word lines. Instead, a compare signal is sent across the differential bit lines. In other words, the bit lines are driven by compare data. None of the word lines are asserted high and, hence, the bit lines are not driven by the cells and the pre-charge is turned off. Initially, the match line (ML) is pre-charged high (could also be precharged low in a different implementation of the invention). During the compare operation the match enable line (ML_EN) is 0 Volts (or ground). If the compare data matches with the data stored in the X memory cell 52 and the Y memory cell 54, the outcome is a match and the match line stays pre-charged. In case the compare data does not match with the data stored in the X memory cell or the Y memory cell, a mismatch occurs and the match line (ML) is discharged to the level of match enable (ML_EN), which is preferably 0 volts (or ground) during the search operation. During other operations, the match enable (ML_EN) is held at the same level as the match line (ML). The match line may be pre-charged to, say around 500 mV with reference to ground or $V_{SS}$, in order to limit the swing of the match line, which in turn reduces the switching current from the match logic of the compare circuit 56.

The TCAM cell has X-cell and Y-cell components. The X-cell and Y-cell are used to realize a bit-encoded implementation of the Value and Mask cells traditionally associated with a TCAM. The encoding of the Value and Mask into "X" and "Y" is done by circuitry external to the TCAM cell. The logical functioning of the cell is detailed in Table 1 below:

TABLE 1

Logical operation of TCAM cell

| X | Y | FUNCTION |
| --- | --- | --- |
| 0 | 0 | Always Match |
| 0 | 1 | Compare 1 |
| 1 | 0 | Compare 0 |
| 1 | 1 | Always Mismatch |

Compare circuit 56, therefore, functions to compare the compare signals sent on the common bit/compare lines with the logic values stored in the X and Y cells. If a logic 0 is stored in the X-cell (on the output node of the inverter pair 64, 66) AND a logic 0 is stored in the Y-cell (on the output node of the inverter pair 64, 66), the transistors 84 and 86 in the compare circuit 56, will always be OFF and so the match line (ML) will remain at its pre-charged value irrespective of the values on the CMP and /CMP lines. Hence, a Match will always be indicated.

Conversely if a logic 1 is stored in the X-cell (on the output node of the inverter pair 64, 66) and a logic 1 is stored in the Y-cell (on the output node of the inverter pair 64, 66), the transistors 84 and 86 in the compare circuit 56, will always be ON. So the match line (ML) will always be pulled LOW because either CMP or /CMP will be at a logic 1 value (if a logic 1 is being compared, CMP will be a logic 1 and if a logic 0 is being compared, /CMP will be a logic 1). If CMP is a logic 1, then the match line (ML) will be pulled LOW through transistors 82 and 84, while if /CMP is a logic 1, the match line (ML) will be pulled LOW through transistors 86 and 88. Hence, the logic function will be "Always Mismatch."

In the case where a logic 1 is stored in the X-cell (on the output node of the inverter pair 64, 66) AND a logic 0 is stored in the Y-cell (on the output node of the inverter pair 64, 66) transistor 84 is ON and transistor 86 is OFF. So the match line (ML) will stay precharged only if transistor 82 is OFF. This will happen if a logic 0 is driven on CMP (and hence logic 1 driven on /CMP). This is the case of compare for a logic 0. If a logic 1 is driven on CMP (and hence logic 0 driven on /CMP) transistor 82 will be ON and the match line (ML) will be pulled low through transistors 82 and 84 thereby indicating a mismatch.

In the case where a logic 0 is stored in the X-cell (on the output node of the inverter pair 64, 66) AND a logic 1 is stored in the Y-cell (on the output node of the inverter pair 64, 66) transistor 86 is ON and transistor 84 is OFF. So the match line (ML) will stay precharged only if transistor 88 is OFF. This will happen if a logic 1 is driven on CMP (and hence logic 0 driven on /CMP). This is the case of compare for a logic 1. If a logic 0 is driven on CMP (and hence logic 1 driven on /CMP) transistor 88 will be ON and the match line (ML) will be pulled LOW through transistors 86 and 88 thereby indicating a mismatch.

Compare circuit embodies no more than four transistors 82, 84, 86, and 88. Transistor pairs 82 and 84 are connected in series with each other, transistors 86 and 88 are connected in series with each other and the combination of transistors 82 and 84 are connected in parallel with transistors 86 and 88. Transistor pair 82 and 84, as well as transistor pair 86 and 88, are connected between a power source and ground. The power source is the match line (ML) pulled upward through a pull-up transistor (not shown) to say about 500 mV. The ground is selectively placed on the match line enable (ML_EN) conductor only during the compare operations. At other times, the match line enable is placed at the same voltage level as the pull-up value on the match line. Thus, compare circuit 56 is activated only during a compare operation, whereby the match line can be pulled downward to the match line enable voltage value whenever a mismatch occurs (i.e., whenever either transistors 82 and 84 are ON or transistors 86 and 88 are ON).

Compare circuit 56 can be realized either with MOS transistors or bipolar transistors. If MOS transistors are used, the transistors can be configured as NMOS transistors, or PMOS transistors, depending on how they are arranged, to form the logic function needed to register a match line being pulled down whenever a mismatch occurs. Accordingly the match line and match_en line voltages will have to be adjusted/arranged. Regardless of its configuration, compare circuit 56, along with X memory cell 52 and Y memory cell 54, are each connected to a common conductor. Given that TCAM cell 50 operates with differential pairs, two common conductors can be used. If two common conductors are used, those conductors carry either a bit line being written to X memory cell 52, Y memory cell 54, or a compare line being forwarded to compare circuit 56 for comparison with the previously stored bit line voltage value. The concept of only using a single common conductor (or two common conductors—one being complimentary to the other) for connection to both memory cells and the compare circuit substantially reduces the amount of conductors needed by the overall TCAM cell 50. Thus, TCAM cell 50 can be made much smaller than typical TCAM cells. Use of a single common conductor or dual common conductors is shown implemented with a maximum of 16 transistors within TCAM cell 50.

Figure 4:
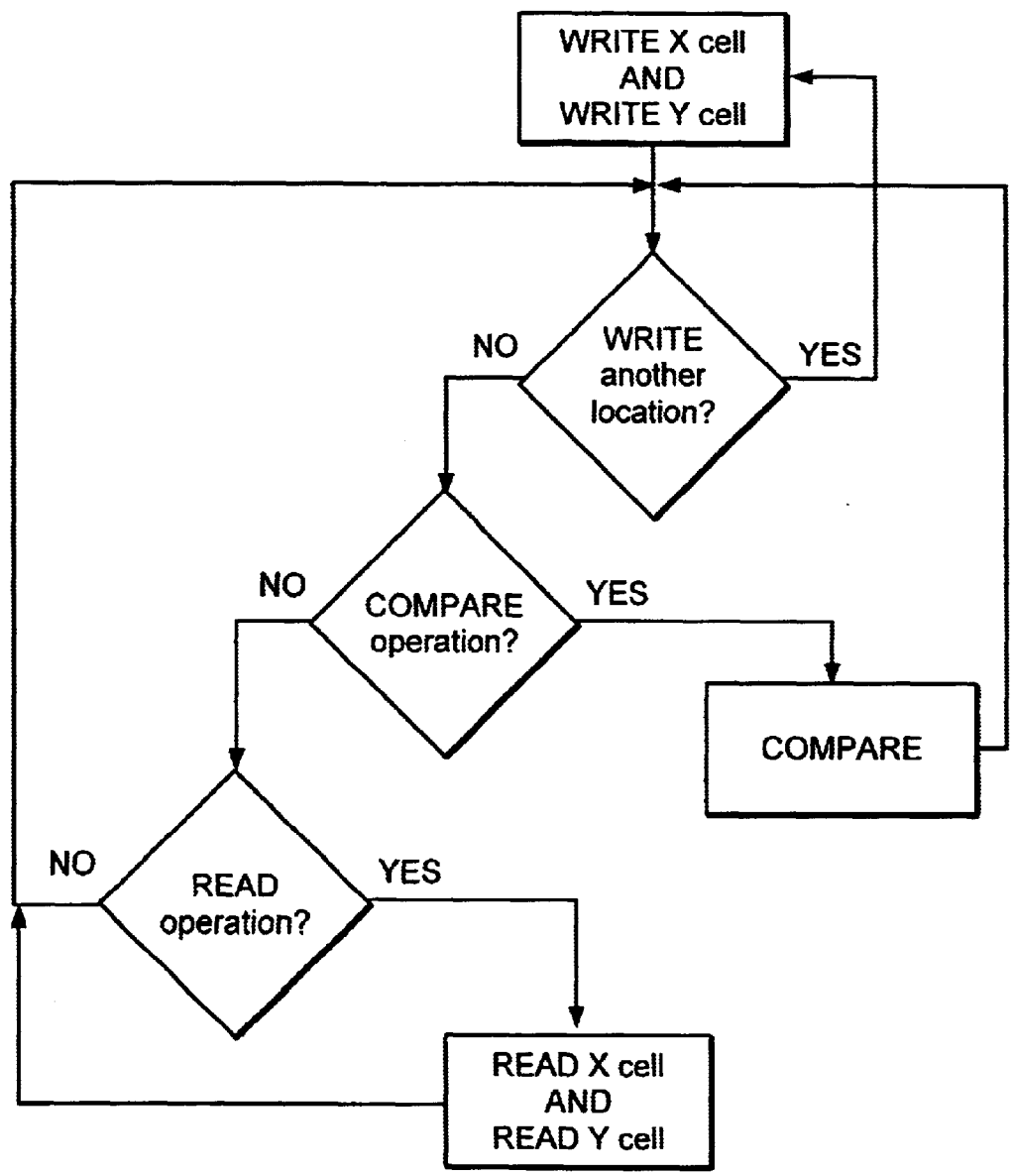
FIG. 4 is a flow diagram of different operations (write, read and compare) performed on the memory array.

Referring to FIG. 4, a flow diagram is shown of a sequence of operations that can occur within a TCAM cell. For example, data can be written to the X memory cell by strobing the common conductors with a bit line voltage value and strobing the corresponding data word line, XWL. By strobing the X word line, whatever voltage value is on the common pairs of conductors will be forwarded to the X memory cell. Similarly data may be written into the Y memory cell by strobing the common conductors with a bit line voltage value and strobing the corresponding data word line, YWL. During the write operation the match enable line conductor (ML_EN) is held at a precharged voltage value equal to the voltage value of the match line conductor (ML) so as to save power from being burnt in the compare portion of the TCAM cell.

A search or compare operation begins by not asserting either the X word line or the Y word line, and instead of the bit line/complementary bit line pair being available to receive voltage values to be written into or read from the memory cells, the bit line/complementary bit line pair is used to receive a compare/complementary compare signal pair. A compare signal is strobed onto the multiplexed/common conductor or conductors and the match line enable conductor is strobed to a voltage value less than the precharged match line (preferably 0 Volts or ground).

Data may also be read from each of the X and Y memory cells. In each of these cases (as in the case of the write operation) the match enable line conductor (ML_EN) is held at a precharged voltage value equal to the voltage value of the match line conductor (ML) so as to save power from being burnt in the compare portion of the TCAM cell. To read the X cell, the wordline associated with this cell, XWL, is driven active and the cell drives data on the bitline conductor pair. To read the Y cell, the wordline associated with this cell, YWL, is driven active and the cell drives data on the bitline conductor pair.

A write operation to X memory cells involves precharging ML_EN at precharged value of ML, and driving B, /B and XWL. A write to Y memory cells involves precharging ML_EN at precharged value of ML, and driving B, /B and YWL. A read to X memory cells involves precharging ML_EN at precharged value of ML and driving XWL. A read to Y memory cells involves precharging ML_EN at precharged value of ML and driving YWL. A compare operation involves driving ML_EN at 0 volts or ground, with XWL and YWL being OFF and driving CMP and /CMP.

It will be appreciated to those skilled in the art having the benefit of this disclosure, that the embodiments described herein are believed to be applicable to a TCAM cell that uses either MOS or bipolar transistors. The size of each transistor dictates the overall size of the TCAM cell; however, the present TCAM cell uses no more than 16 transistors in an SRAM embodiment, where voltage values stored in the X memory cell and the Y memory cell remain indefinitely, provided power is retained to the TCAM cell. The amount of additional reduction in size of the TCAM cell is dependent on whether the architecture requires an SRAM or a DRAM. If DRAM is required, then much fewer than 16 transistors are needed. Part of the reduction in size is attributable not only to having fewer transistors, but also using only a single common conductor (or dual common conductors in a differential arrangement) coupled to both X and Y memory cells, as well as the compare circuit. The following claims are to be interpreted to embrace all such modifications and changes, and the specification and drawings are to be regarded in an illustrative, rather than a restrictive; sense.

What is claimed is:

1. A memory, comprising:
   a conductor;
   a storage cell coupled to store a first voltage value forwarded across the conductor; and
   a compare circuit coupled to compare the stored first voltage value against a second voltage value forwarded across the conductor subsequent to the first voltage value being forwarded across the conductor.

2. The memory as recited in claim 1, wherein the storage cell comprises a pair of cross-coupled inverters.

3. The memory as recited in claim 1, wherein the compare circuit comprises a pair of transistors connected in series between a power source and ground, and wherein a gate conductor of one transistor within the pair is coupled to receive the first voltage value stored in the storage cell and the other transistor within the pair is coupled to receive the second voltage value forwarded across the conductor.

4. The memory as recited in claim 1, further comprising a multiplexer coupled to place the first voltage value upon the conductor during a write operation to the storage cell, and to place the second voltage value upon the conductor during a compare operation subsequent to the write operation.

5. The memory as recited in claim 1, further comprising an encoder coupled to encode a bit that signals a write operation or a compare operation and, depending on the value of said bit, to place either the first voltage or the second voltage upon the conductor.

6. The memory as recited in claim 1, further comprising a match line coupled to receive a signal indicating a match if a magnitude of the first and second voltage values are substantially equal.

7. A ternary content addressable memory cell, comprising:
   a X memory cell;
   a Y memory cell;
   a compare circuit; and
   a common conductor pair coupled to the X memory cell, the Y memory cell and the compare circuit for receiving a first voltage value during a write operation and a second voltage value during a compare operation.

8. The ternary content addressable memory cell as recited in claim 7, further comprising a multiplexer coupled to place the first voltage value upon the single conductor during the write operation and to place the second voltage value upon the single conductor during a compare operation subsequent to the write operation.

9. The ternary content addressable memory cell as recited in claim 7, wherein the X and Y memory cells each comprises a pair of cross-coupled inverters that receive the first voltage value during the write operation.

10. The ternary content addressable memory cell as recited in claim 7, wherein the X memory cell consists of no more than six transistors, the Y memory cell consists of no more than six transistors, and the compare circuit consists of no more than four transistors.

11. The ternary content addressable memory cell as recited in claim 7, wherein the ternary content addressable memory cell consists of no more than sixteen transistors.

12. The ternary content addressable memory cell as recited in claim 7, wherein the X memory cell and the Y memory cell are static random access memory (SRAM) cells.

13. The ternary content addressable memory cell as recited in claim 7, wherein the compare circuit comprises:
   a match line coupled to receive a signal that indicates the contents within the memory cell matches the second voltage value forwarded during the compare operation;
   a common node adapted to receive either a power supply voltage during the write/read operation and a ground supply voltage during a compare operation;
   a first pair of transistors coupled in series between the match line and the common node; and
   a second pair of transistors coupled between the match line and the common node.

14. A ternary content addressable memory cell, comprising:
   a common conductor adapted to receive a first bit and a second bit, wherein the first bit is adapted to be written to and stored within the memory cell during a write operation or read from the memory cell during a read operation, and the second bit is adapted to be compared with the stored first bit during a compare operation of the memory cell;
   an X memory cell coupled to the common conductor for receiving the first bit, wherein the X memory cell consists of no more than six transistors, four of which form a main pair of cross-coupled inverters, and another two of which form main pass-through connections paths to respective ones of the main pair of cross-coupled inverters;
   a Y memory cell coupled to the common conductor, wherein the Y memory cell consists of no more than six transistors, four of which form a masking pair of cross-coupled inverters, and another two of which form masking pass-through connections paths to respective ones of the masking pair of cross-coupled inverters;
   a match line conductor adapted to receive a power supply voltage;
   a match line enable conductor adapted to receive the power supply voltage during times when the first bit is placed upon the common conductor and to receive a ground supply voltage during times when the second bit is placed upon the common conductor; and
   a compare circuit coupled to the common conductor for receiving the first bit and the second bit, wherein the compare circuit consists of no more than four transistors arranged in two pairs of transistors, wherein each pair of transistors is connected in series between the match line enable conductor and the match line conductor.

15. The ternary content addressable memory cell as recited in claim 14, wherein the match line conductor is pulled to the ground supply voltage during a time within the compare operation during which a voltage value of the first bit is substantially equal to a voltage value of the second bit.

16. The ternary content addressable memory cell as recited in claim 14, wherein the X pair of cross-coupled inverters receive the first bit and a complementary voltage value of the first bit during the write operation.

17. The ternary content addressable memory cell as recited in claim 14, wherein the Y pair of cross-coupled inverters receive the first bit and a complementary voltage value of the first bit during a write operation to the Y memory cell.

18. A method for operating a content addressable memory cell, comprising:
   (a) while forming a conductive path to a latch, strobing a bit line connected to the conductive path with a first voltage value placed upon the latch;
   (b) while maintaining the first voltage value upon the latch, strobing the bit line again with a second voltage value; and
   (c) if the first voltage value equals the second voltage value, forwarding a match signal from the memory cell.

19. The method as recited in claim 18, wherein said forwarding a match signal comprises placing the first and second voltage values upon gate conductors of a pair of series-connected transistors only during times when the pair of series-connected transistors are selectively coupled between a power supply voltage and a ground supply voltage.

* * * * *